(12) United States Patent
Allen

(10) Patent No.: US 10,381,990 B2
(45) Date of Patent: *Aug. 13, 2019

(54) DYNAMICALLY CONFIGURABLE BIAS CIRCUIT FOR CONTROLLING GAIN EXPANSION OF MULTI-MODE, SINGLE CHAIN LINEAR POWER AMPLIFIERS

(71) Applicant: Skyworks Solutions, Inc., Woburn, MA (US)

(72) Inventor: Wade C. Allen, Brookline, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/897,049

(22) Filed: Feb. 14, 2018

(65) Prior Publication Data

US 2018/0294779 A1 Oct. 11, 2018

Related U.S. Application Data

(63) Continuation of application No. 14/456,975, filed on Aug. 11, 2014, now Pat. No. 9,917,549.

(60) Provisional application No. 61/864,378, filed on Aug. 9, 2013.

(51) Int. Cl.
| | |
|---|---|
| *H03F 3/04* | (2006.01) |
| *H03F 1/02* | (2006.01) |
| *H03F 3/19* | (2006.01) |
| *H03F 3/10* | (2006.01) |
| *H03G 1/00* | (2006.01) |
| *H03G 3/30* | (2006.01) |

(52) U.S. Cl.
CPC ............ *H03F 3/19* (2013.01); *H03F 1/0266* (2013.01); *H03G 1/0017* (2013.01); *H03G 3/30* (2013.01); *H03F 2200/18* (2013.01); *H03F 2200/27* (2013.01); *H03F 2200/411* (2013.01); *H03F 2200/451* (2013.01); *H03F 2200/516* (2013.01); *H03G 2201/40* (2013.01)

(58) Field of Classification Search
USPC .......................... 330/285, 296, 288–289, 51
See application file for complete search history.

(56) References Cited

U.S. PATENT DOCUMENTS

| | | | |
|---|---|---|---|
| 6,639,470 B1 | 10/2003 | Andrys et al. | |
| 6,753,734 B2 * | 6/2004 | Arell | G05F 3/265 |
| | | | 330/288 |

(Continued)

*Primary Examiner* — Hieu P Nguyen
(74) *Attorney, Agent, or Firm* — Knobbe, Martens, Olson & Bear LLP

(57) ABSTRACT

In a preferred embodiment, the gain expansion in low power mode of a single chain PA is minimized by dynamically adjusting the output impedance of the bias circuit of each gain stage for each mode of operation. Instead of switching in a series attenuator or switching in additional feedback in the first gain stage of a single-chain PA to limit the gain at the increased quiescent current level, this embodiment achieves linear performance by adjusting the quiescent current in each stage to the minimum level that meets the target gain and then increasing the output resistance of the bias circuit of each gain stage in low power mode (LPM) to provide the appropriate level of negative feedback at the base of each amplifying HBT to linearize the gain versus power response.

20 Claims, 15 Drawing Sheets

(56) References Cited

U.S. PATENT DOCUMENTS 7,129,786 B2 10/2006 Kim et al.
8,253,492 B2 8/2012 Hijikata et al.

\* cited by examiner

DYNAMICALLY CONFIGURABLE BIAS CIRCUIT FOR CONTROLLING GAIN EXPANSION OF MULTI-MODE, SINGLE CHAIN LINEAR POWER AMPLIFIERS

CROSS-REFERENCE TO RELATED APPLICATION

This application is a continuation of U.S. application Ser. No. 14/456,975, filed on Aug. 11, 2014 and titled "A DYNAMICALLY CONFIGURABLE BIAS CIRCUIT FOR CONTROLLING GAIN EXPANSION OF MULTI-MODE, SINGLE CHAIN LINEAR POWER AMPLIFIERS," which is hereby incorporated by reference in its entirety herein and which claims benefit of the Aug. 9, 2013 filing date of provisional application Ser. No. 61/864,378, which is incorporated herein by reference in its entirety.

BACKGROUND

Gain expansion occurs when the gain of an amplifier stage increases as its input drive power increases due to the signal dependent change in the bias point of the amplifier. Thus, the magnitude of gain expansion correlates to the bias point of the amplifier stage. As the amplifier quiescent bias is reduced toward Class B operation, the increasing gain expansion introduces a trade-off between linearity and efficiency.

Current single chain, multi-mode linear heterojunction bipolar transistor (HBT) radio frequency (RF) power amplifiers (PA) suffer from large gain expansion when they are biased at lower quiescent current levels in order to reduce the amplifier's gain and power output in medium or low power modes. The excess gain expansion can be alleviated by increasing the quiescent bias current to the level that limits gain expansion and achieves sufficient linearity at the desired output power level. However, if the increased quiescent bias current leads to excess power gain in the low or medium power mode, the gain must be reduced to the specified target by switching in a series attenuator or by switching in additional feedback in the early gain stages. This approach limits the minimum level of quiescent bias current that can be achieved and requires additional circuitry to be added, such as FET switches, to achieve the additional power modes.

SUMMARY

In a preferred embodiment of the invention, the gain expansion in low power mode of a single chain PA is minimized by dynamically adjusting the output impedance of the bias circuit of each gain stage for each mode of operation. Instead of switching in a series attenuator or switching in additional feedback in the first gain stage of a single-chain PA to limit the gain at the increased quiescent current level, this embodiment achieves linear performance by adjusting the quiescent current in each stage to the minimum level that meets the target gain and then increasing the output resistance of the bias circuit of each gain stage in low power mode (LPM) to provide the appropriate level of negative feedback at the base of each amplifying HBT to linearize the gain versus power response.

BRIEF DESCRIPTION OF DRAWING

These and other objects, features and advantages of the invention will be more readily apparent from the following detailed description in which.

DETAILED DESCRIPTION

Figure 1:
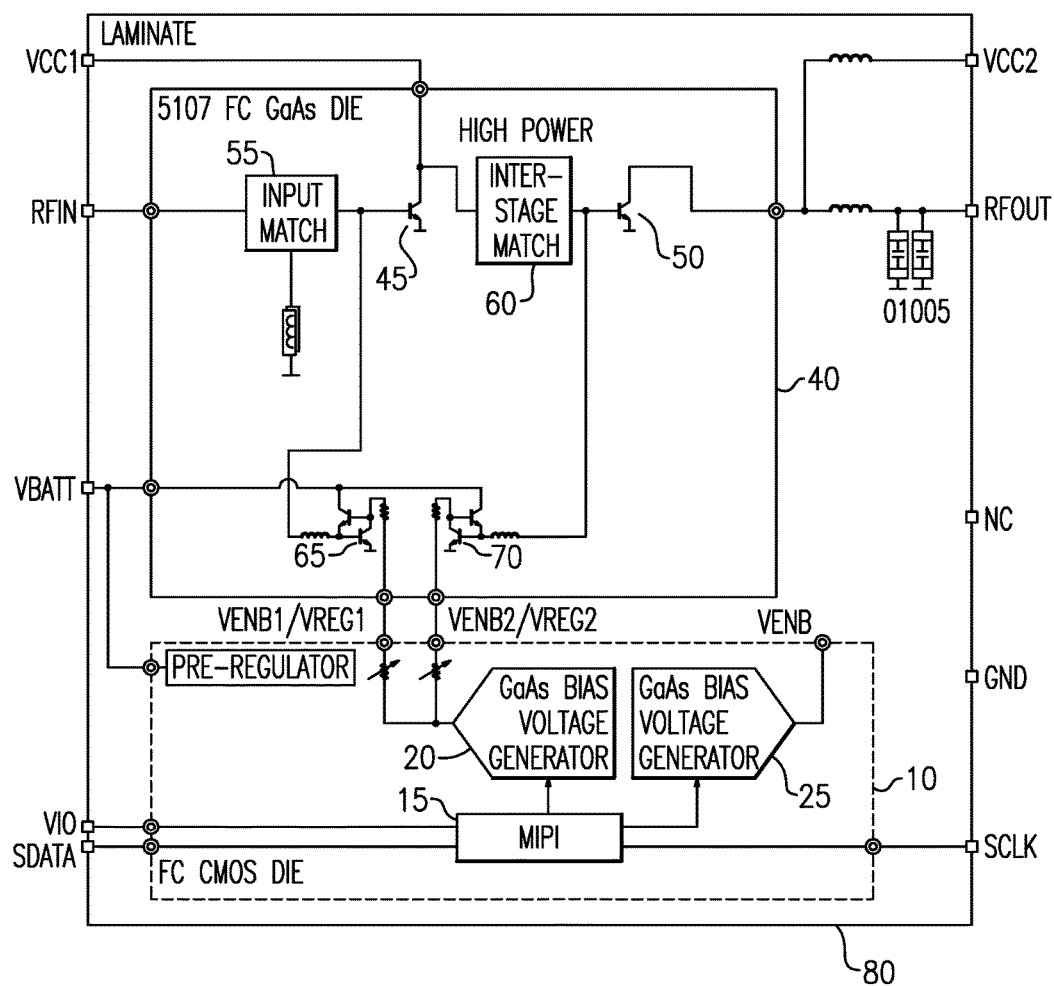
FIG. 1 is a block diagram of a conventional MIPI controlled GaAs power amplifier module.

FIG. 1 depicts the low power mode function for a single chain, Mobile Industry Processor Interface (MIPI) controlled GaAs PA. In this architecture, the regulator voltage and mode control functions are implemented on a CMOS die 10 while the RF path of the amplifier is implemented on a GaAs die 40 with the two die finally combined on a multi-layer laminate 80. For illustrative purposes, only a single gain stage is shown; but it will be recognized that additional gain stages may be connected at the input and/or output of the stage that is shown.

CMOS die 10 comprises a MIPI controller 15 and first and second bias voltage generators 20, 25. MIPI controller receives inputs including VIO and SDATA and produces outputs including a clock signal SCLK and control signals to the bias voltage generators 20, 25. Bias voltage generator produces regulated voltages VREG1 and VREG2 and control signals VENB1 and VENB2.

GaAs die 40 comprises first and second series connected power amplifiers 45, 50, an input matching circuit 55, an inter-stage matching circuit 60, a first current mirror 65 and a second current mirror 70. VREG1 is used to control the current output from current mirror 65; and VREG2 is used to control the current output from current mirror 70.

As noted above, conventional PA circuits such as that of FIG. 1 are subject to large gain expansion when they are biased at lower quiescent current levels for operation in medium or low power modes. Efforts to reduce the gain expansion while also operating in medium or low power modes have led to switching series attenuators into the circuit or switching in additional feedback. The present invention seeks to realize multiple power/gain modes without switching in additional feedback circuits or series attenuators. As a result, there is no need for FET devices on the GaAs die.

Figure 2:
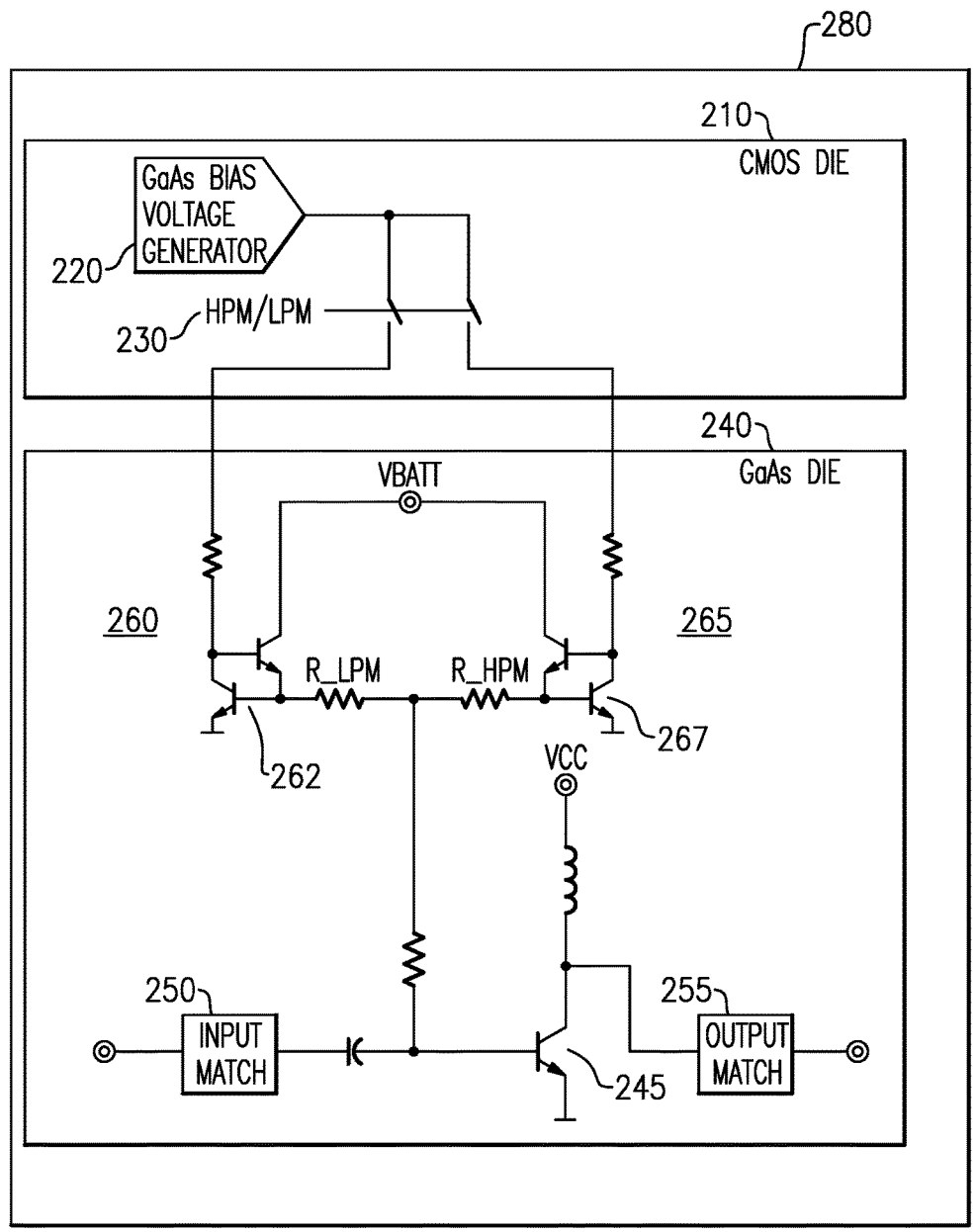
FIG. 2 is a block diagram of an illustrative embodiment of the invention.

FIG. 2 is a schematic representation of an illustrative embodiment of the invention. It comprises a CMOS die 210, a GaAs die 240 and a laminate 280. Again, the CMOS die includes the regulator voltage and mode control functions and the RF path of the amplifier is implemented on the GaAs die with the two die finally combined on the multi-layer laminate. Again, only a single gain stage is shown in FIG. 2; but it will be understood that additional gain stages may be connected at the input and/or output of the stage that is shown.

CMOS die 210 comprises a MIPI controller (not shown), a bias voltage generator 220, and a mode switch 230. Switch 230 selectively connects the regulated output voltage from generator 220 to either low power mode (LPM) or high power mode (HPM) circuitry on the GaAs die 240.

GaAs die 240 comprises a power amplifier 245, an input matching circuit 250, an output matching circuit 255, a low power mode (LPM) bias circuit 260 and a high power mode (HPM) bias circuit 265. The LPM circuit includes a current mirror 262 and an LPM output resistor R_LPM; and the HPM circuit includes a current mirror 267 and a HPM output resistor R_HPM. Optionally, additional bias circuits may also be used at other power modes. While each stage of the amplifier has multiple parallel bias circuits such as circuits 260, 265, it will be appreciated that only one such circuit is enabled for each operating mode via the mode switch 230 in the CMOS regulator output.

In accordance with the invention, the CMOS regulator voltage is set to provide the appropriate quiescent bias current for the desired gain mode. Multiple current mirrors are placed in parallel and enabled independently so that the bias circuit output resistance (e.g., R_LPM or R_HPM) can be determined for each mode of operation thereby optimizing the amplifier linearity at each respective peak power level.

Figure 3A:
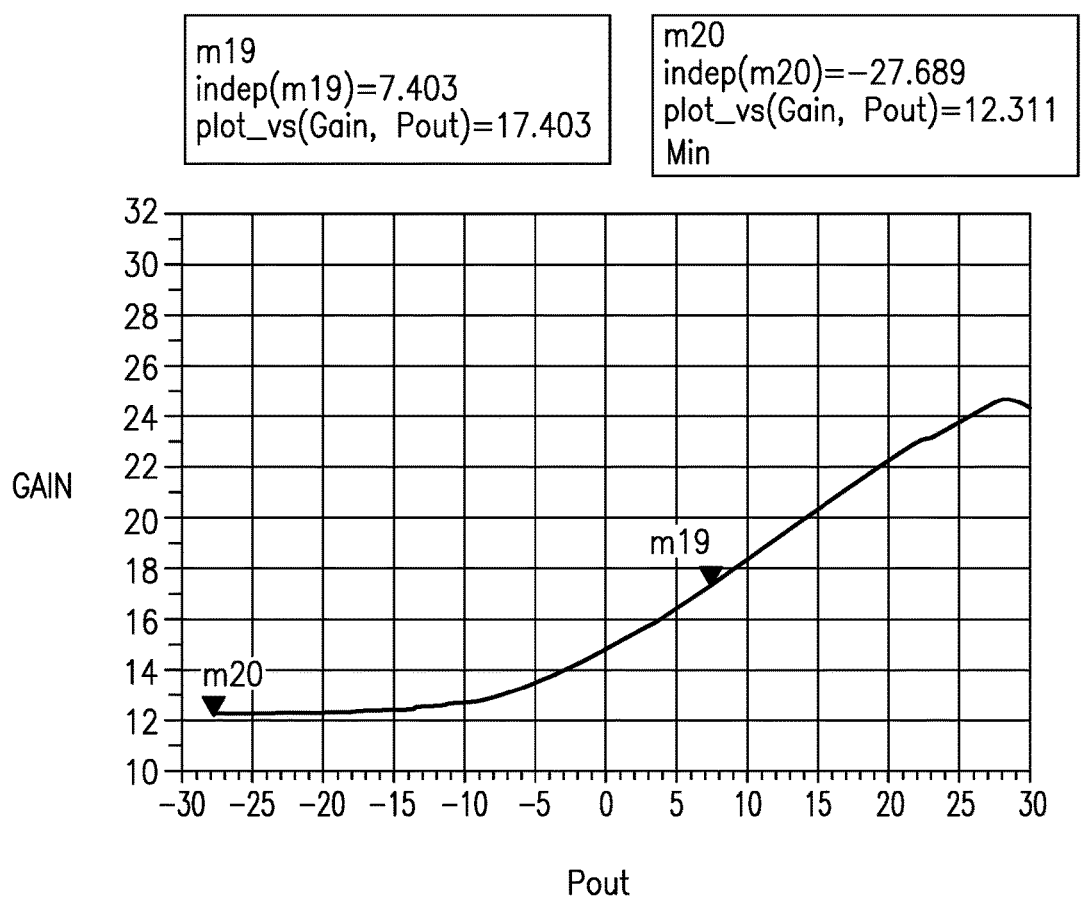
FIGS. 3A and 3B are plots of (A) gain versus output power and (B) single collector current versus output power for a simulation of a single-chain HBT amplifier with reduced quiescent bias current.
Figure 3B:
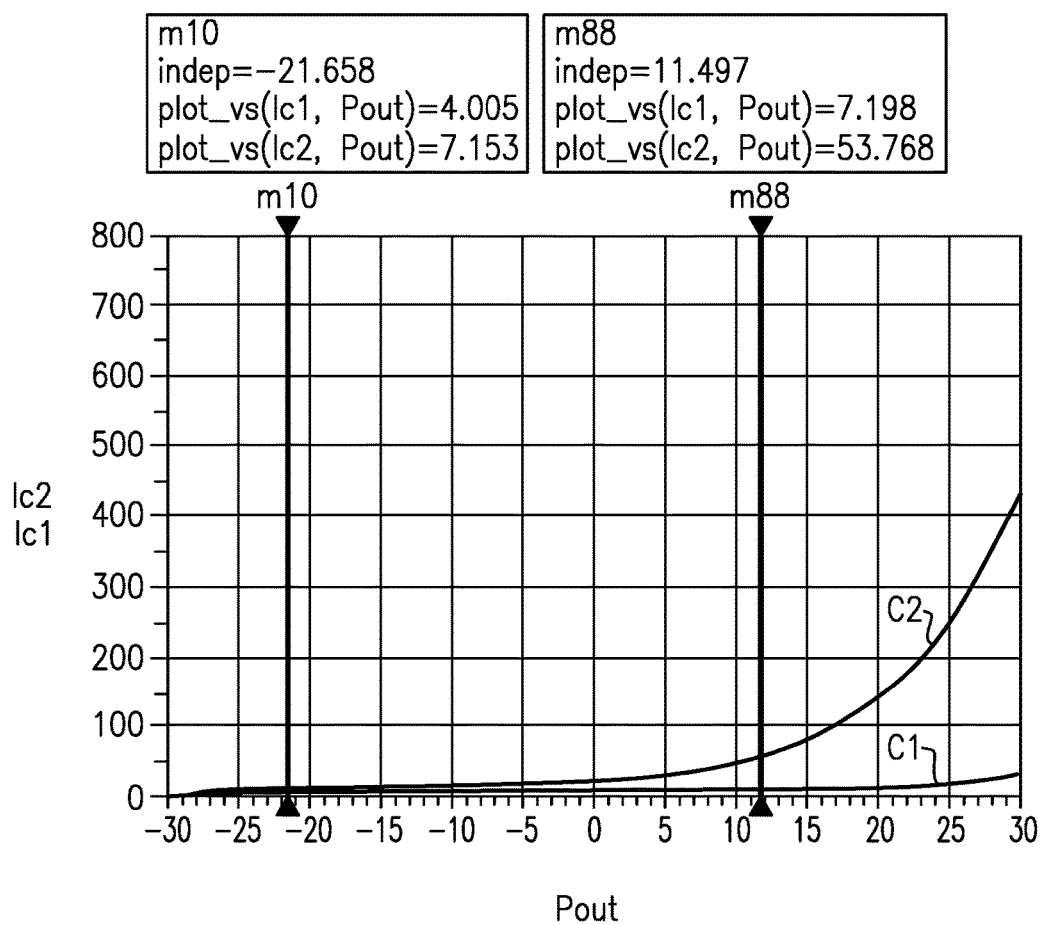

Illustrative details of this process are as follows. In the target implementation of this invention, the PA is composed of a single chain of two gain stages with two operating modes: high power mode (HPM) and low power mode (LPM). The baseline PA design is optimized for HPM operation of 25 dB gain at 31.25 dBm output power at 2 dB compression, and then operated at a reduced quiescent current level for LPM operation at 12 dB gain and 7 dBm linear output power. The single-chain LPM gain is achieved by reducing the PA quiescent current by reducing the output voltage from bias voltage generator 220 until the gain drops to 12 dB without changing any device sizes, inter-stage or output matching impedances. However, as shown in FIGS. 3A and 3B, decreasing the quiescent bias of a single chain GaAs PA to 20 mA to reduce gain results in excessive gain expansion for linear operation at the target power level. Thus, simply reducing the bias current is not sufficient for realizing the LPM operation for the single chain design without sacrificing the quiescent current, Icq, for lower gain expansion.

Figure 4A:
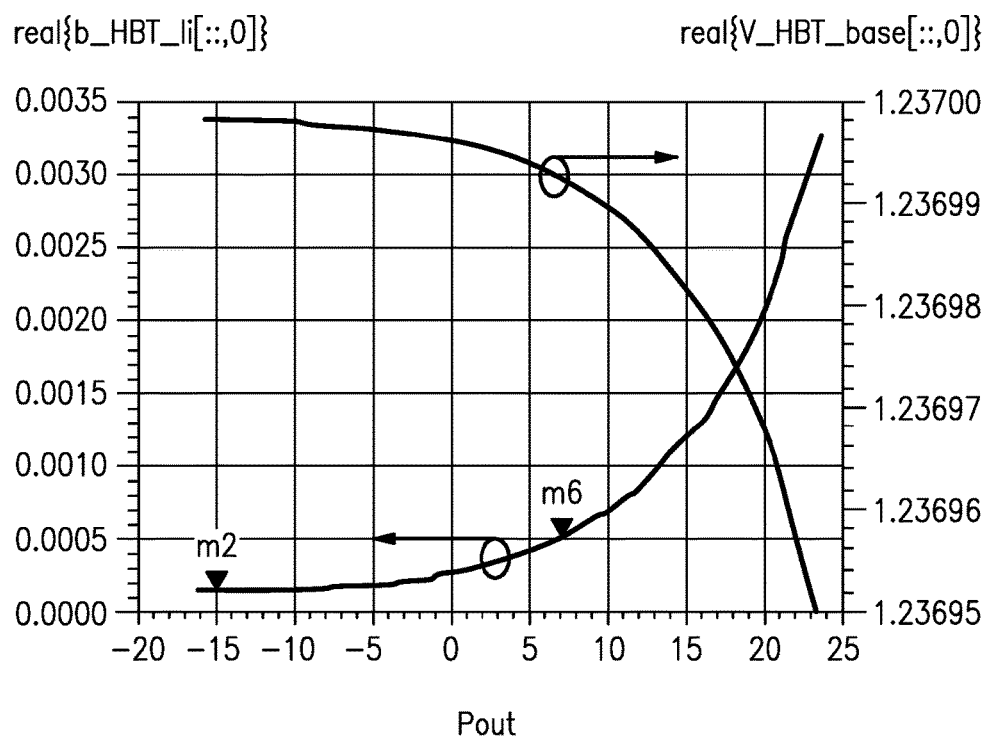
FIGS. 4A, 4B and 4C are plots of (A) large signal base current and base voltage versus output power, (B) large signal gain versus output power, and (C) small signal gain versus quiescent collector current for a simulation of an HBT amplifier output stage.
Figure 4B:
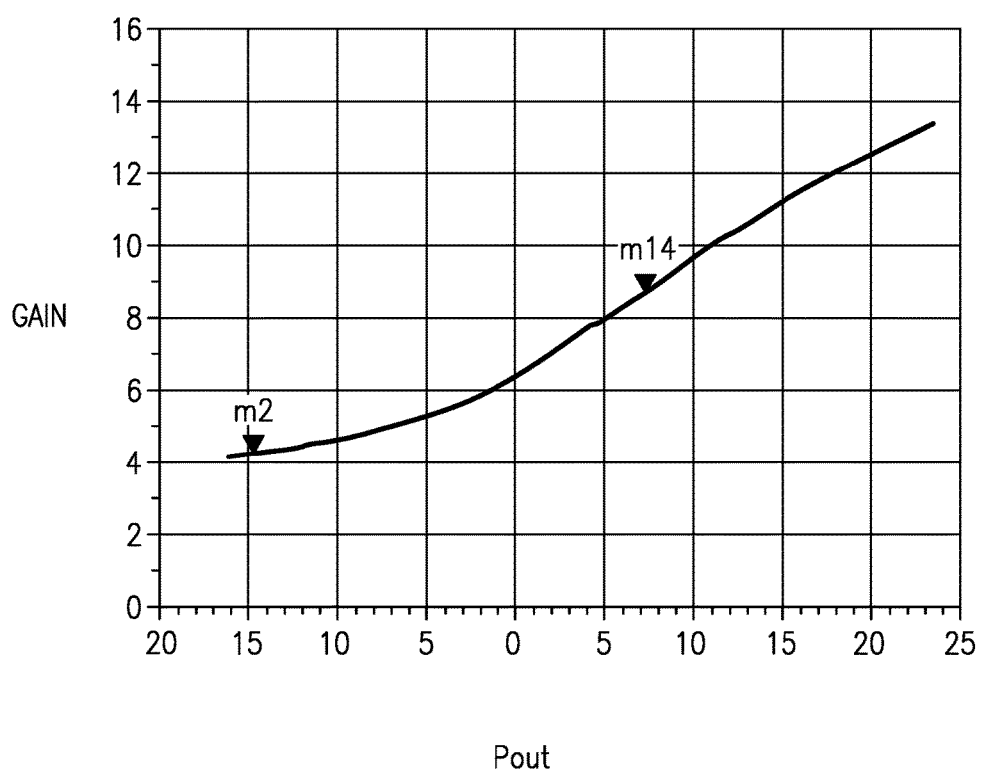
Figure 4C:
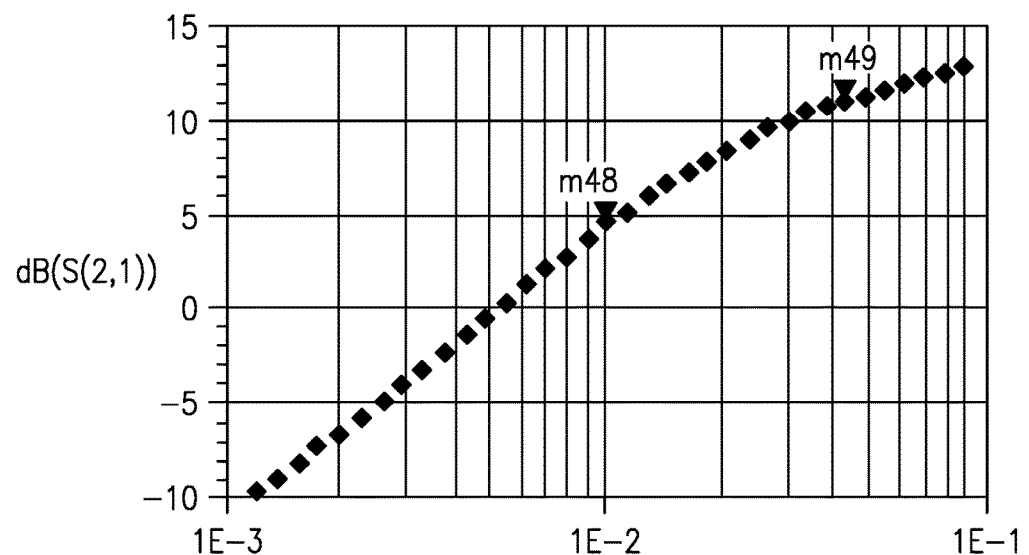

For an HBT amplifier biased in Class B or Class AB region with a current mirror having low DC output impedance, the collector current increases with input power due to the rectification of the input RF waveform at the base terminal of the transistor. The additional bias current is sourced from the current mirror so that the amplifier self-biases versus input signal level. FIG. 4 (A) illustrates how the average base current of the second gain stage of the PA increases from 125 uA to 500 uA over an output power range of −15 to 7 dBm while the base voltage drop of 20 mV is due to the ballast resistors. FIG. 4(B) illustrates that the gain expansion over this same power range is 3.0 dB. Finally, an s-parameter simulation of the small signal gain versus base current for the same amplifier was performed to demonstrate the large signal gain expansion is due to the increasing bias current. FIG. 4 (C) shows that the small signal gain S(2,1) increases by 4.5 dB. over the equivalent dynamic range as the large signal power sweep.

Figure 5:
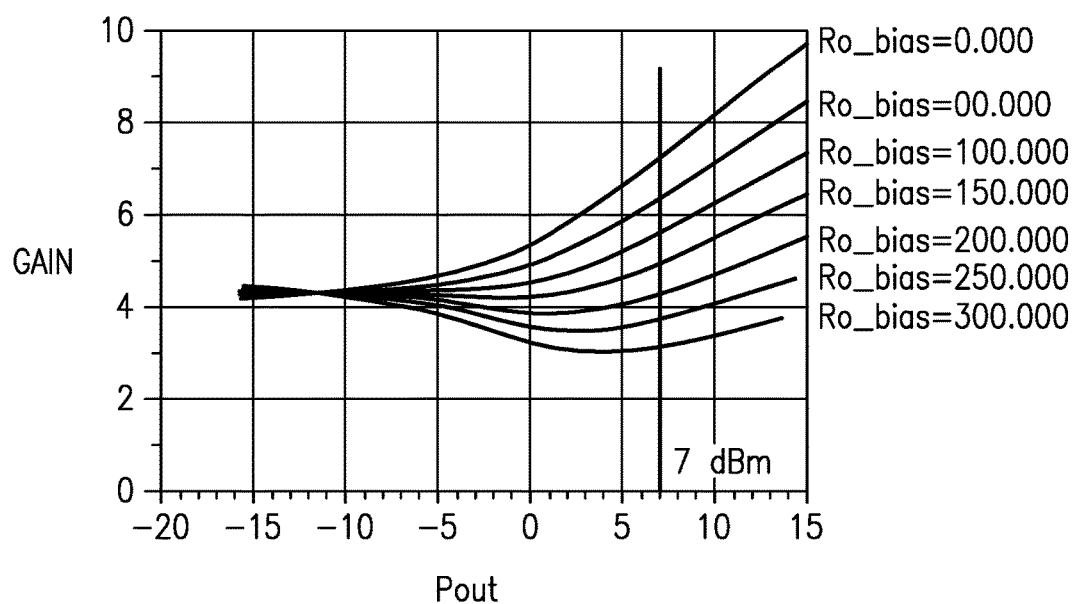
FIG. 5 is a plot depicting gain expansion versus bias mirror output resistance for an amplifier output stage biased at 10 mA quiescent current.

To compensate for the large gain expansion at reduced quiescent current levels, it is necessary to increase the output resistance of the current mirror in LPM to provide negative feedback at the base via the rectified current. As the base current increases versus input power, the base voltage will drop proportionately to the base current times bias output resistance and limit the gain of the amplifier stage. It will take more input drive to generate the same output power as the current mirror output resistance increases. FIG. 5 shows a simulated gain versus output power versus bias mirror output resistance (in ohms) of the amplifier output stage with emitter area of 3200 um2 biased at 10 mA quiescent current. The plots show that as the resistance increases the amount of gain expansion is reduced at the target power level of 7 dBm. This dependence of gain expansion on bias mirror output resistance is then utilized to realize linear low power mode operation in the single chain amplifier by selecting appropriate impedance values for the resistances R_LPM and R_HPM in the bias circuits 260, 265.

Figure 6A:
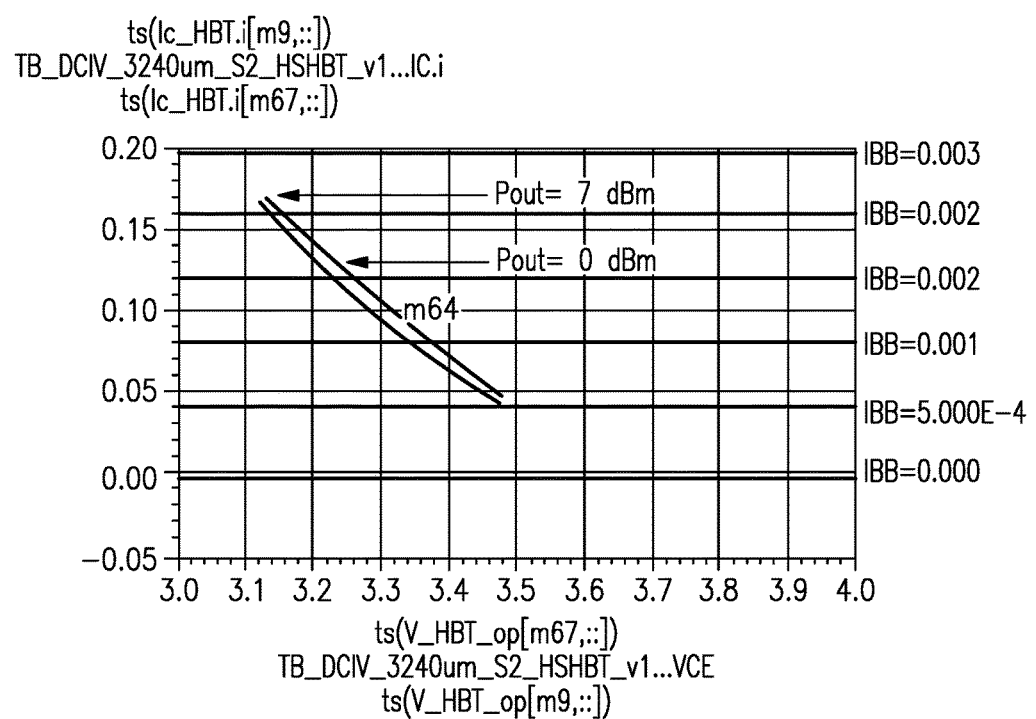
FIGS. 6A, 6B and 6C depict the load line of the output stage for three different quiescent current levels: (A) 100 mA, (B) 30 mA, and (C) 10 mA for Pout=0dBm and Pout=7 dBm.
Figure 6B:
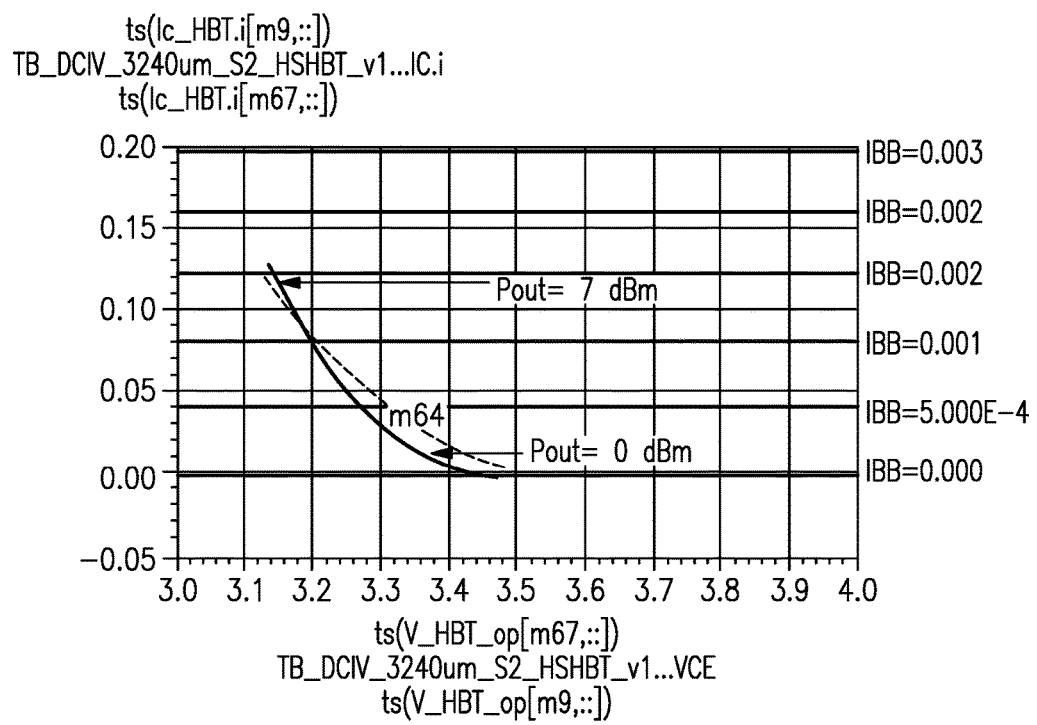
Figure 6C:
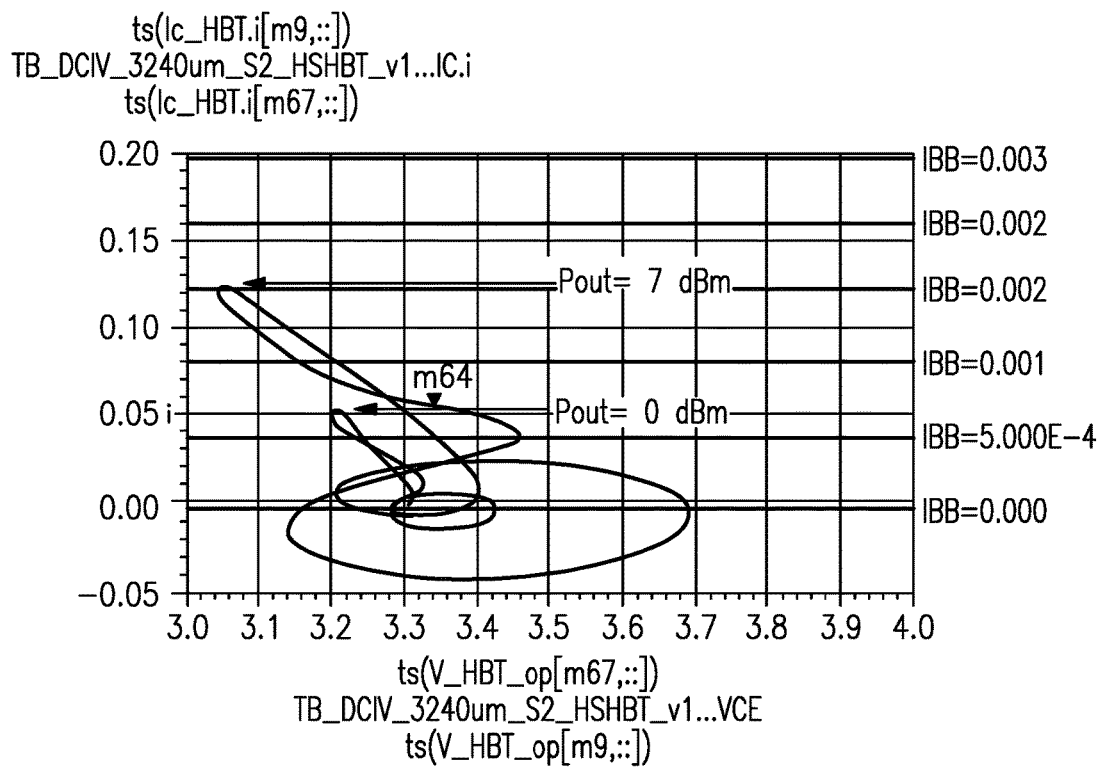

In addition, a look at the load line in FIGS. 6(A), 6(B), and 6(C) of the output stage of the amplifier for three difference quiescent collector current settings of 100 mA, 30 mA, and 10 mA illustrates that the dynamic output swing does not change at 0 dBm output power and 7 dBm output power. Only the average current shifts down with decreasing collector bias shown especially in the step from 100 mA to 30 mA. The 10 mA plot shows significant collector voltage clipping as the stage is biased further into Class B operation. The amount of harmonic distortion that is tolerable and the minimum gain requirement will determine the minimum quiescent current achievable for each amplifier stage. Full amplifier simulation shows that this distortion is filtered in the output matching network so that the linearity requirements can still be met.

Figure 7A:
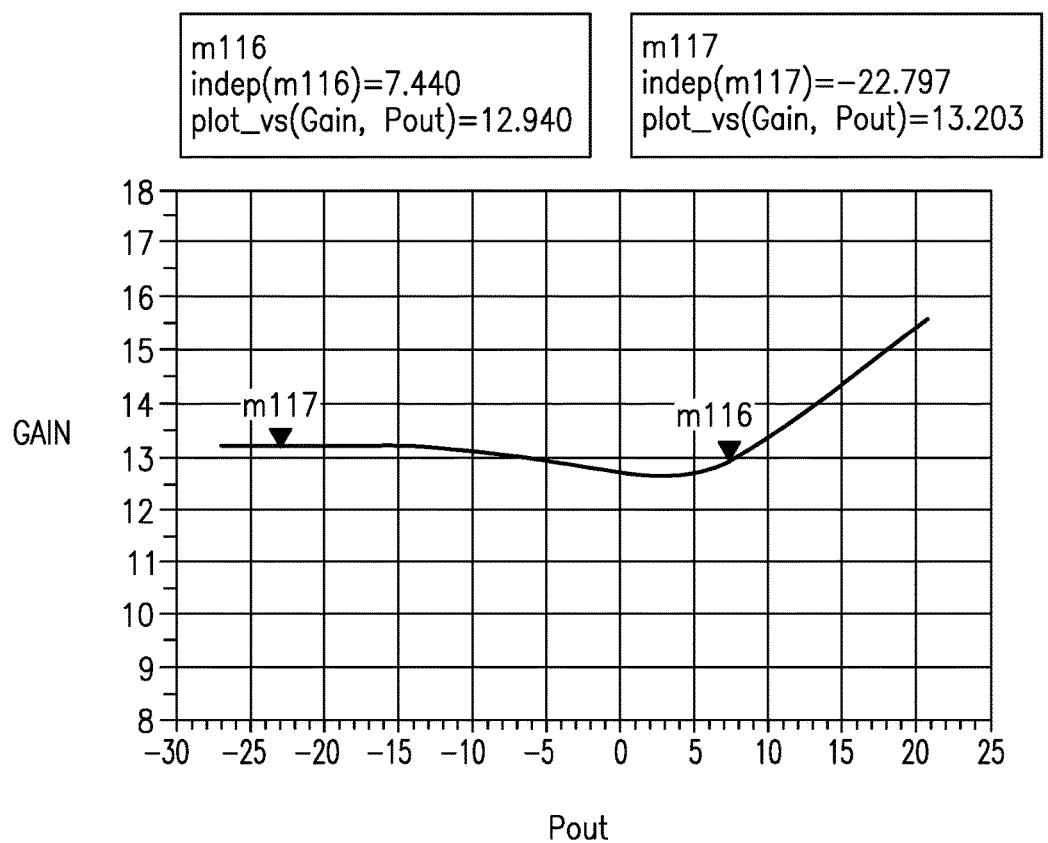
FIGS. 7A, 7B and 7C are plots of (A) gain versus output power, (B) stage currents versus output power; and (C) power and adjacent channel power ratio (ACPR) versus output power for a simulation of a single-chain GaAs power amplifier with switched bias.
Figure 7B:
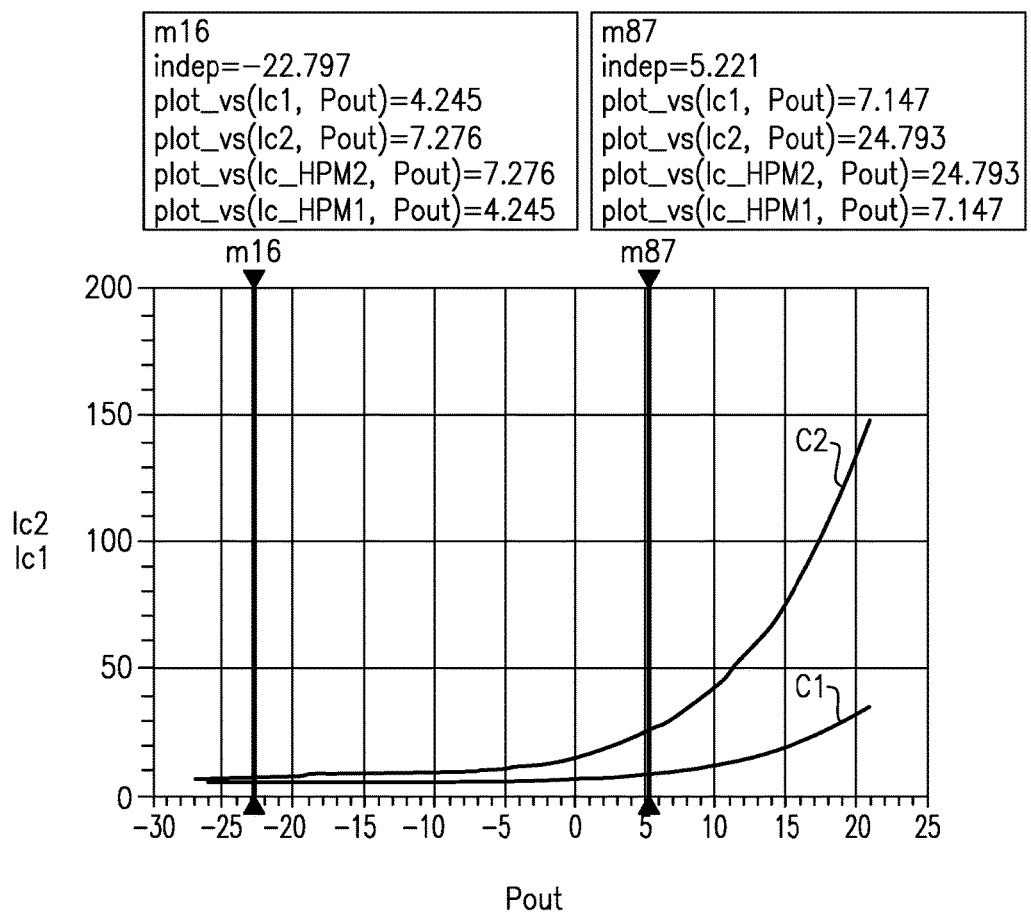
Figure 7C:
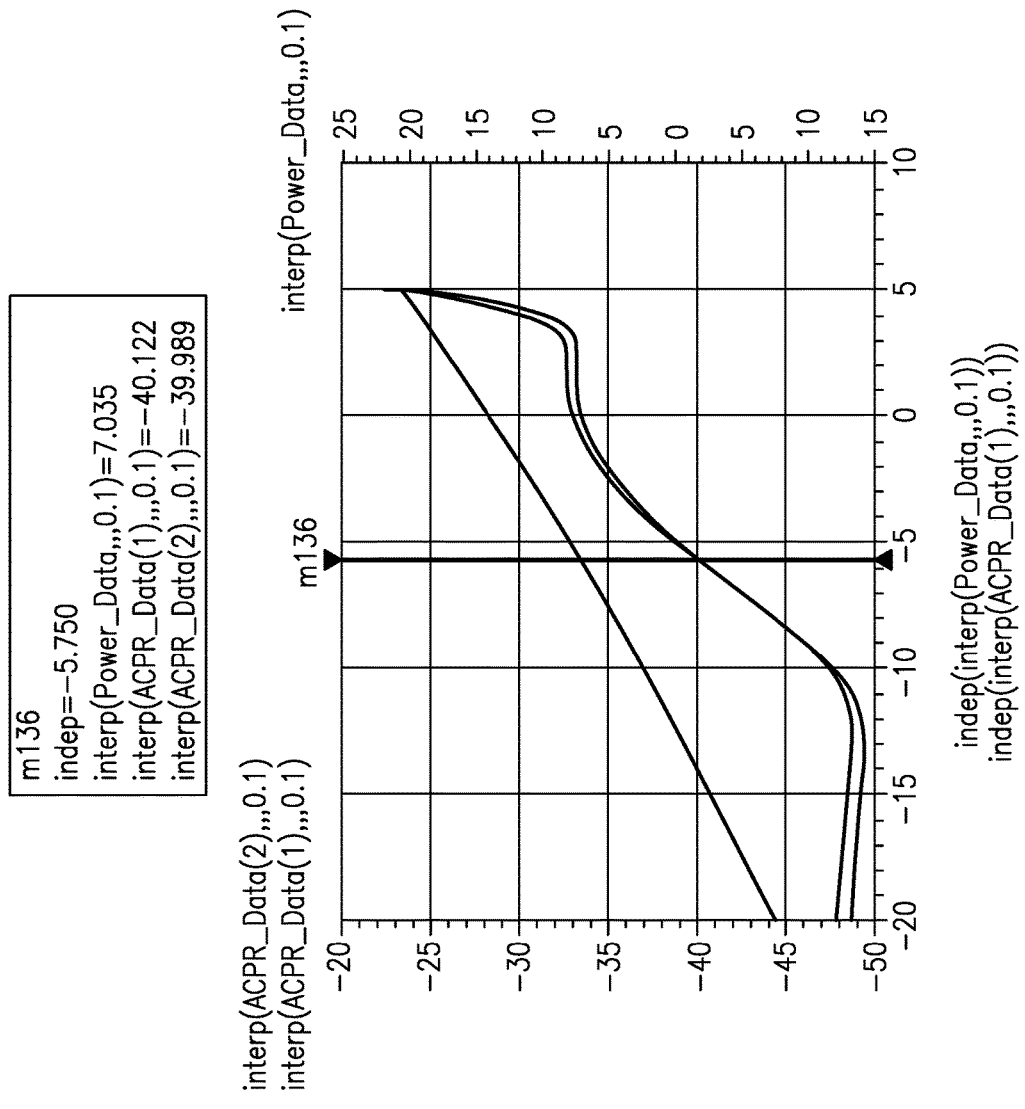

Finally, FIGS. 7(A), 7(B), and 7(C) show a simulation result of the single chain amplifier of FIG. 2 with the increased mirror output resistance implemented for LPM. No gain expansion now occurs at the targeted adjacent channel power ration (ACPR) of −40 dBc at Pout of 7 dBm while the total quiescent current has been reduced to 12 mA.

Figure 8:
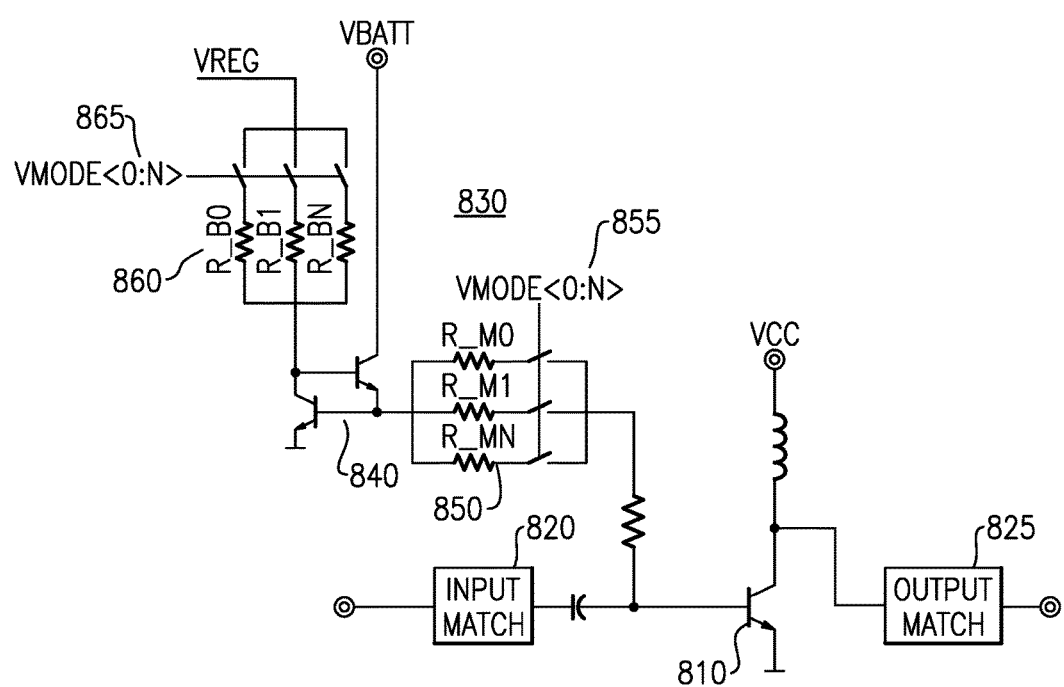
FIG. 8 is a block diagram of a second illustrative embodiment of the invention.

FIG. 8 shows an alternative all GaAs BiFET only implementation of the invention. The circuit comprises a power amplifier 810, an input matching circuit 820, and output matching circuit 825, and a bias circuit 830. Bias circuit 830 comprises a single current mirror 840 with an array 850 of output resistors R_M<N:0> that are selectable by a mode switch 855 to set the desired output impedance for the given amplifier mode. An array 860 of resistors R_B<N:0> are selected by a mode switch 865 to establish the desired quiescent bias current of the amplifier stage for each respective mode of operation. For illustrative purposes, only a single gain stage is shown; but it will be recognized that additional gain stages may be connected at the input and/or output of the stage that is shown.

As will be apparent to those skilled in the art, numerous variations may be practiced within the spirit and scope of the present invention.

What is claimed is:
1. A power amplifier module comprising:
a first semiconductor die including a power amplifier having a plurality of operating modes and a plurality of bias circuits, each bias circuit of the plurality of bias circuits associated with a different operating mode from the plurality of operating modes and each bias circuit including an independently enabled current mirror with a current mirror ratio and a bias current mirror level so as to configure the power amplifier at a particular quiescent current level corresponding to a particular operating mode from the plurality of operating modes; and a second semiconductor die including a voltage generator configured to generate a voltage and a configurable switch network that selectively applies the voltage to one of the plurality of bias circuits based at least in part on an operating mode selected from the plurality of operating modes while not applying the voltage to one other of the plurality of bias circuits based at least in part on the operating mode selected from the plurality of operating modes.

2. The power amplifier module of claim 1 wherein the first semiconductor die is a Gallium Arsenide die and the second semiconductor die is a complementary metal-oxide-semiconductor die.

3. The power amplifier module of claim 1 wherein the second semiconductor further includes a controller that selects the operating mode from the plurality of operating modes.

4. The power amplifier module of claim 1 wherein each bias circuit of the plurality of bias circuits has an output impedance selected to optimize gain expansion and linearity for a corresponding operating mode.

5. The power amplifier module of claim 1 wherein the power amplifier is a single-chain power amplifier.

6. The power amplifier module of claim 1 wherein the plurality of operating modes correspond to a plurality of power or gain modes.

7. The power amplifier module of claim 6 wherein the plurality of power or gain modes are enabled without a feedback circuit or series attenuator.

8. The power amplifier module of claim 1 wherein the first semiconductor die further includes an input matching circuit between an input of the first semiconductor die and an input of the power amplifier.

9. The power amplifier module of claim 1 wherein the first semiconductor die further includes an output matching circuit between an output of the first semiconductor die and an output of the power amplifier.

10. A multi-chip module, the multi-chip module comprising:

a first semiconductor die of a first material, the first semiconductor die including a power amplifier having a plurality of operating modes and a plurality of bias circuits, each bias circuit of the plurality of bias circuits associated with a different operating mode from the plurality of operating modes, and each bias circuit of the plurality of bias circuits including an independently enabled current mirror with a current mirror ratio and a bias current mirror level so as to configure the power amplifier at a particular quiescent current level corresponding to a particular operating mode from the plurality of operating modes; and a second semiconductor die of a second material, the second semiconductor die configured to selectively apply a voltage to one of the plurality of bias circuits based at least in part on an operating mode selected from the plurality of operating modes while not applying the voltage to one other of the plurality of bias circuits based at least in part on the operating mode selected from the plurality of operating modes.

11. The multi-chip module of claim 10 further comprising a multi-layer laminate supporting the first and second semiconductor die.

12. The multi-chip module of claim 10 wherein the first material is Gallium Arsenide and the second material is a complementary metal-oxide-semiconductor material.

13. The multi-chip module of claim 10 wherein the power amplifier is a single-chain power amplifier.

14. The multi-chip module of claim 10 wherein the plurality of operating modes correspond to a plurality of power or gain modes.

15. The multi-chip module of claim 10 wherein the first semiconductor die further includes one or more matching circuits in communication with the power amplifier.

16. A power amplifier module comprising:

a power amplifier configurable to operate in a plurality of operating modes;

a bias circuit including a current mirror and a first array of selectable resistors, the current mirror separate from the power amplifier and configurable with a current mirror ratio and a bias current mirror level so as to configure the power amplifier at a particular quiescent current level corresponding to a particular operating mode from the plurality of operating modes, the first array of selectable resistors configured to set a particular output impedance corresponding to the particular operating mode from the plurality of operating modes; and a second array of selectable resistors configured to set the particular quiescent current level corresponding to the particular operating mode from the plurality of operating modes.

17. The power amplifier module of claim 16 further comprising a first switch array that selects one or more resistors from the first array of selectable resistors based at least in part on the particular operating mode from the plurality of operating modes.

18. The power amplifier module of claim 16 further comprising a second switch array that selects one or more resistors from the second array of selectable resistors based at least in part on the particular operating mode from the plurality of operating modes.

19. The power amplifier module of claim 16 wherein the power amplifier is a single-chain power amplifier.

20. The power amplifier module of claim 16 further comprising one or more matching circuits in communication with the power amplifier.

* * * * *